(12) United States Patent
Poloni et al.

(10) Patent No.: US 8,675,756 B2
(45) Date of Patent: Mar. 18, 2014

(54) METHOD FOR IDENTIFYING RECEIVED SYMBOLS CORRUPTED BY BURST NOISE AND RELATED DEVICE

(75) Inventors: Angelo Poloni, Fino del Monte (IT); Stefano Valle, Milan (IT); Stefano Vincenti, Pisa (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 185 days.

(21) Appl. No.: 13/189,769

(22) Filed: Jul. 25, 2011

(65) Prior Publication Data

US 2012/0020400 A1    Jan. 26, 2012

(30) Foreign Application Priority Data

Jul. 26, 2010    (IT) ............... VA2010A0055

(51) Int. Cl.
*H04L 5/12*    (2006.01)
*H04L 23/02*    (2006.01)

(52) U.S. Cl.
USPC ............ 375/262; 375/343; 714/781; 714/793

(58) Field of Classification Search
USPC .......................... 375/262, 343; 714/781, 793
See application file for complete search history.

(56) References Cited

U.S. PATENT DOCUMENTS

| | | | |
|---|---|---|---|
| 5,875,200 A * | 2/1999 | Glover et al. ................. | 714/784 |
| 6,374,383 B1 * | 4/2002 | Weng ............................ | 714/781 |
| 2004/0205444 A1 * | 10/2004 | Arao et al. .................... | 714/788 |
| 2008/0148129 A1 * | 6/2008 | Moon et al. ................... | 714/758 |

OTHER PUBLICATIONS

Kaynak et al., ("Burst Error Identification for Turbo and LDPC Coded Magnetic Recording Systems", Jul. 2004, IEEE, total of 3 pages).*
Nakamura et al., ("Burst Detection by Parity Check Matrix of LDPC Code for Perpendicular Magnetic Recording Using Bit-Patterned Medium", Dec. 2008, IEEE, total of 6 pages).*
Chang et al., "Optimal channel detection for nonbinary coded partial response channels", IEEE Transactions on Communications, vol. 57, No. 7, Jul. 2009, pp. 1892-1895.
Kaynak et al., "Burst error identification for turbo-and LDPC-coded magnetic recording systems", IEEE Transactions on Magnetics, vol. 40, No. 4, Jul. 2004, pp. 3087-3089.

(Continued)

*Primary Examiner* — Sam K Ahn
*Assistant Examiner* — Fabricio R Murillo Garcia
(74) *Attorney, Agent, or Firm* — Allen, Dyer, Doppelt, Milbrath & Gilchrist, P.A.

(57) ABSTRACT

A method for identifying a corrupted received signal that includes symbols is described. Each symbol may have a value of a Galois field associated therewith. The receiver may be configured to store a logarithm of normalized probability mass functions and corresponding Galois field values for each of the symbols. The normalized probability mass functions may be normalized with respect to a greatest probability mass function of a given symbol. The method may include comparing, for each symbol, a logarithm of normalized probability of an n-th best probability value with a respective threshold, counting a number of the logarithms that exceed the respective threshold and generating, for each symbol, a score corresponding to the number. The method may also include calculating a moving average of the scores, and comparing the moving average with an output threshold and flagging a just received symbol as corrupted based upon the comparison.

17 Claims, 3 Drawing Sheets

(56) References Cited

OTHER PUBLICATIONS

Nakamura et al., "Burst detection by parity check matrix of LDPC code for perpendicular magnetic recording using bit-patterned medium", International Symposium on Information Theory, ISITA, Dec. 2008, pp. 1-6.

Xie et al., "Improving burst error tolerance of Ldpc-centric coding systems in read channel", IEEE Transactions on Magnetics, vol. 46, No. 3, Mar. 2010, pp. 933-941.

* cited by examiner

METHOD FOR IDENTIFYING RECEIVED SYMBOLS CORRUPTED BY BURST NOISE AND RELATED DEVICE

FIELD OF THE INVENTION

This invention relates to digital communications and more particularly to a method of identification of data corrupted by burst noise and related device and software for implementing the method.

BACKGROUND OF THE INVENTION

In digital communication systems, a problem yet to be addressed is the presence of relatively long sequences of erroneously recognized bits (bursts). These bursts, due to disturbances of transient nature that affect the communication channel degrading the signal-to-noise ratio, worsen the overall performance of digital communication systems. It may be important to locate bursts in received data streams to read them again or to decode them in a specifically designed way.

A known method of detecting whether a burst has been received includes monitoring the envelope function of the signal to be demodulated. This implies that bursts that do not significantly modify the envelope function may hardly be detected.

Hereinafter, reference is made to communication systems in which transmitted symbols are defined as a sequence of a certain number P of bits that identifies a value of a Galois Field $2^P$, and in which at the demodulator side, the probability mass function (PMF) of symbols, i.e. the probability $P(u=\phi|Y_1^N)$ that a generic symbol u is equal to a certain value $\phi$ of the Galois field (GF) conditioned by a certain vector of samples $Y^N$ has been received, is made available at the output of the demodulator. This calculation can be done regardless the kind of transmission used (QAM, PSK, On/Off, etc), or the channel characteristics (memory-less, ISI channel, etc.) using well known algorithms (for example, symbol based BCJR, as described in Wu Chang and J. R. Cruz, Fellow, "Optimal Channel Detection for Nonbinary Coded Partial Response Channels", *IEEE Transactions on Communications*, vol. 57, no. 7, July 2009, symbol based soft output Viterbi algorithms (SOVA), etc.).

Burst noise worsen statistic figures of a received sequence of bits, thus increasing the probability of an erroneous recognition. The prior art burst detection algorithms are generally based on bit based analysis, rather than on symbol analysis, and are typically inadequate when demodulation is tailored on GF symbols. Among the relevant contributions in this field, the authors Mustafa N. Kaynak, Tolga M. Duma, and Erozan M. Kurtas of "Burst Error Identification for Turbo- and LDPC-Coded Magnetic Recording Systems," *IEEE Transactions on Magnetics*, Vol. 40, no. 4, July 2004, 3087, consider several approaches to identify the burst. Some of them are based on evaluating distortion of the expected signal shape. This type of approach is defeated by bursts of an unexpected type that may disturb the signal in unpredictable and an unidentifiable way. Other approaches are based on constraints imposed by the error correction code. These approaches are generally more onerous because they generally require the introduction of a sort of syndrome checker to identify a potential burst. Finally, the authors of "Burst Error Identification for Turbo- and LDPC-Coded Magnetic Recording Systems," identified above, suggest considering a reliability parameter of the decision based on the probability of bits as estimated by the demodulator (or detector). This is a more general approach.

In "Improving burst error tolerance of LDPC-centric coding systems in read channel," *IEEE Transactions on Magnetics*, Vol. 46, no. 3, March 2010, 933-941, by N. Xie, T. Zhang and E. F. Haratsch, a so-called hybrid concatenated coding is proposed to determine the presence of at least a burst error in the symbols of a read word of symbols. This special and sophisticated coding scheme requires interaction of different codes and is relatively complex. Moreover, it is still based on bit-based operations, and therefore is inadequate for transmission based on GF symbols.

SUMMARY OF THE INVENTION

An effective and reliable real time identification method of received symbols corrupted by burst noise and a related device for implementing it are described. The method includes in comparing the logarithm of at least one of the entries of the probability mass function, sorted in ascending (or descending) order from the least (most) probable value up (down) to the most (least) probable value, of each received symbol with a respective threshold. The method also includes counting the number of logarithms that exceed the corresponding threshold and generating a corresponding score for each received symbol. The generated sequence of scores is processed with a moving average, and the result is compared with an output threshold. When the output threshold is surpassed, the currently received symbol may be identified as corrupted by burst noise.

According to an embodiment, the score may be equal to the counting of the number of logarithms that exceed the respective threshold. According to yet another embodiment, which may be particularly useful in transmission conditions under which the channel characteristics may fluctuate, the thresholds with which the logarithm normalized probability mass functions are compared, may be continuously updated at every symbol received. The method may be implemented with a software computer program or with a related hardware device.

DETAILED DESCRIPTION OF THE PREFERRED EMBODIMENTS

The method will be disclosed referring to a situation in which the symbols may assume one out of eight values of a Galois Field $2^3$, though the same observations hold true for any generic Galois Field $2^P$. Any type of transmission modulation (QAM, PSK, On/Off, etc.) may be used, provided that the probability mass function (PMF) of the values of each symbol is available at the receiver side.

Figure 1:
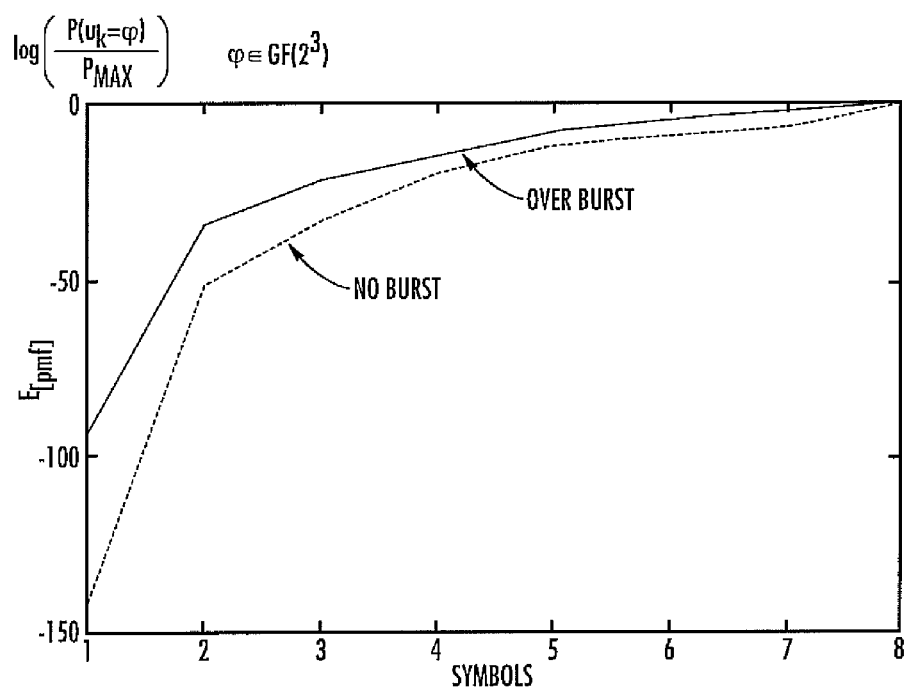
FIG. 1 is a sample graph of the logarithm of the probability of erroneous assessment of the value of a Galois Field $2^3$ assumed by a received symbol.

For each received symbol, the receiver outputs a list of probability values (PMF) that the received symbol corresponds to the possible values of the Galois Field. In FIG. 1, the PMF of a received symbol, sorted from the most probable value (that in the example is 1) down to the least probable value (that in the example is 8), are shown. The line labeled "No burst" is the average unconditional sorted PMF (AUSPMF), in the logarithm domain, of a symbol received outside of burst noise, and the line labeled "Over burst" is the AUSPMF of a symbol received during burst noise. As expected, the in-burst received symbols show greater uncertainness than that of out-of-burst received symbols.

Therefore, if there is a (long) burst in a received stream of data, a behavior similar to the one described with the line labeled "Over burst" is expected for a subsequent (large) number of symbols. Therefore, according to the method, the PMF of values calculated at the receiver side for a received symbol are processed and compared with thresholds fixed according to the method for determining whether the received symbol is corrupted by burst noise.

Figure 2:
FIG. 2 is a schematic block diagram of a device architecture for an algorithm for assessing the presence of a burst corrupting a received symbol according to the present invention.

In FIG. 2, a block diagram of an apparatus according to an embodiment is illustrated. The logarithms of the normalized probability values (more briefly the LogPMF) $\log(P(u=\phi|Y_1^N)/P_{MAX})$ available at the output of the receiver for each received symbol, are sorted from the largest to the smallest value and are compared with respective thresholds PMF_THRE, determined, as will be explained hereinafter. A score corresponding to the number of LogPMF exceeding the respective thresholds is assigned to the received symbol. By repeating the above operations for each received symbol, a sequence S(i) of scores is generated, and by processing this sequence, the symbols corrupted by burst noise are identified.

The sequence is preferably processed with a moving average filter (MA FILTER), that generates a moving average of the input sequence S(i) which, on its turn, is compared with a respective output threshold METRIC THRESHOLD. When this last threshold is exceeded, the presence of burst noise may be flagged, and the received symbol may be recognized as corrupted by burst. Tests carried out showed that relatively outstanding results may be obtained by calculating the moving average on 16 consecutive values of the sequence S(i), though a different number of consecutive values may be used.

The value of the METRIC THRESHOLD may be fixed by a user with a trial and error procedure in order to reduce the number of false and missing recognition of symbols corrupted by burst noise. In practice, this threshold may be linked to the number of PMF terms (from 1 to $2^P-1$) that make up the sequence of scores S(i).

The thresholds PMF_THRE with which the sorted PMF of each symbol are compared generally depend on the working conditions on which the symbols are received. Therefore, even if it may be theoretically possible to let the user fix them heuristically, this may impose an onerous task to accomplish.

Figure 3:
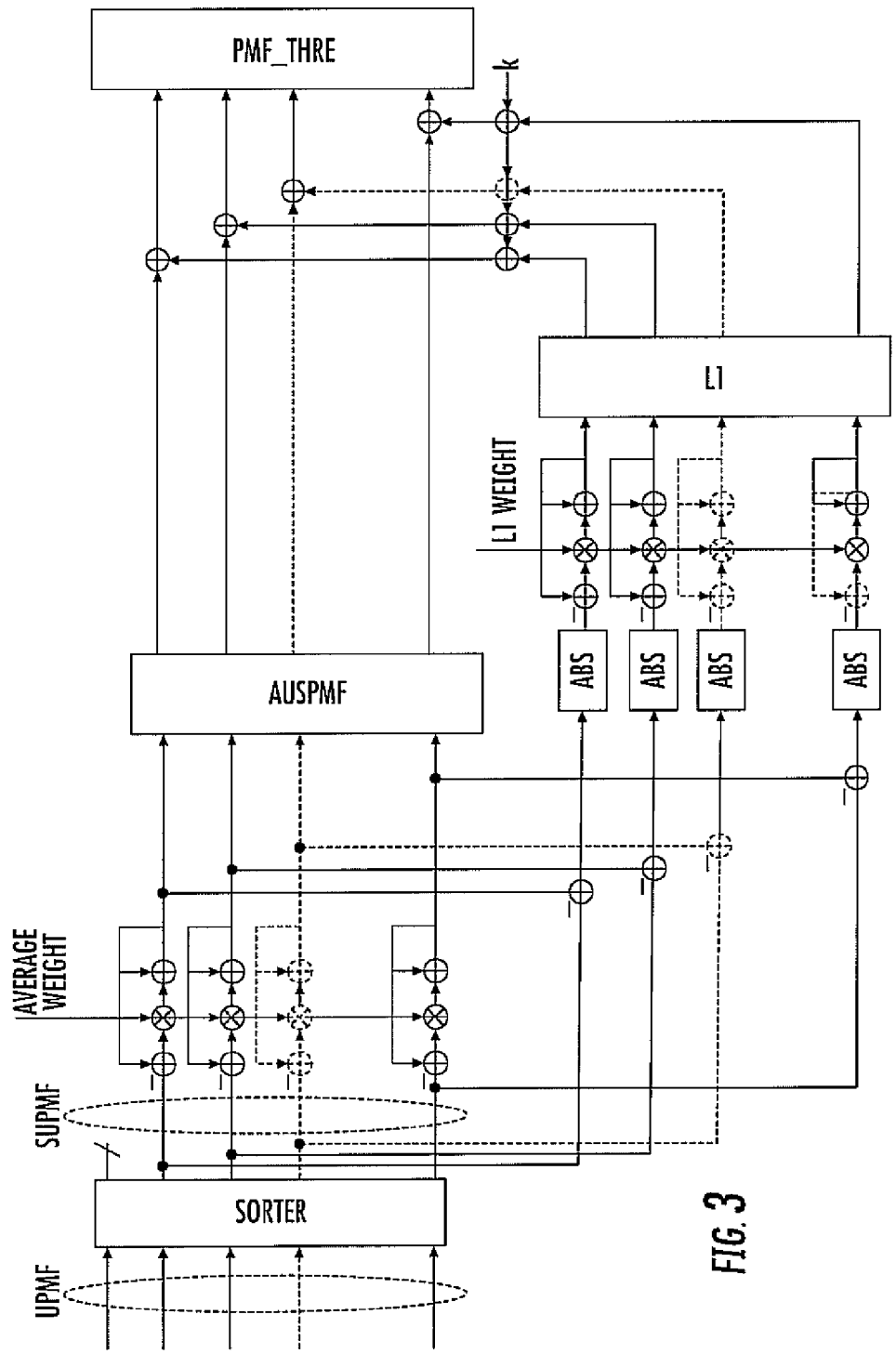
FIG. 3 is a functional block diagram illustrating the algorithm according to the present invention.

According to an aspect of the method, an algorithm for automatically setting and continuously updating the thresholds PMF_THRE is provided, and is schematically illustrated in FIG. 3. The unconditional PMF $\log(P(u=\phi|Y_1^N)/P_{MAX})$ are calculated for each received symbol, and these unconditional PMF are sorted from the largest value down to the smallest value, obtaining as many values SUPMF. Due to normalization with respect to largest unconditional PMF for every symbol, the first is 0, and for this reason it is not taken into consideration.

For each generic n-th largest unconditional PMF, the respective threshold PMF_THRE is preferably calculated as follows:

a moving average AUSPMF(n; i) of a number h of values of the sequence of n-th largest unconditional PMF of the incoming symbols is calculated for each received symbol i:

$$AUSPMF(n; i) = \frac{1}{h} \cdot \sum_{x=i-h+1}^{x=i} SUPMF(n; x);$$

the absolute value of the difference between the current n-th largest unconditional PMF, i.e. SUPMF(n; i), and the corresponding moving average AUSPMF(n; i) is calculated:

|SUPMF(n;i)−AUSPMF(n;i)|;

a moving average of a number j of the above absolute values is calculated:

$$L1(n; i) = \frac{1}{j} \cdot \sum_{x=i-j+1}^{x=i} |SUPMF(n; x) - AUSPMF(n; x)|;$$

the threshold PMF_THRE(n; i) for the n-th largest unconditional PMF of the i-th symbol is calculated as follows:

PMF_THRE(n;i)=AUSPMF(n;i)+k·L1(n;i);

wherein k is a parameter that may be fixed or programmed by the user according to the needs.

The above algorithm for determining the thresholds PMF_THRE(n; i) is relatively convenient because the parameter k may be determined substantially independently from the working conditions in which the symbols are received. Therefore, it may be possible to heuristically fix the parameter k only once, knowing in advance that the method will continue showing relatively good performance in terms of probability of missed detection or false detection of bursts even if the working conditions change.

The value L1(n; i) may be calculated differently from that shown above. Only for sake of example, it may be calculated using an L2 norm:

$$\sqrt{\frac{1}{j} \cdot \sum_{x=i-j+1}^{x=i} (SUPMF(n; x) - AUSPMF(n; x))^2} \ ;$$

or even a norm of a higher order, though the norm L1 is preferred because it is simpler and faster to be calculated.

As an alternative to the above algorithm, it may be possible to process a limited subset of the sorted PMF of the generic i-th symbol, and not all of them to reduce the number of calculations, for example. In this case, the PMF of the limited subset may be considered for generating the sequence S(i).

Figure 4:
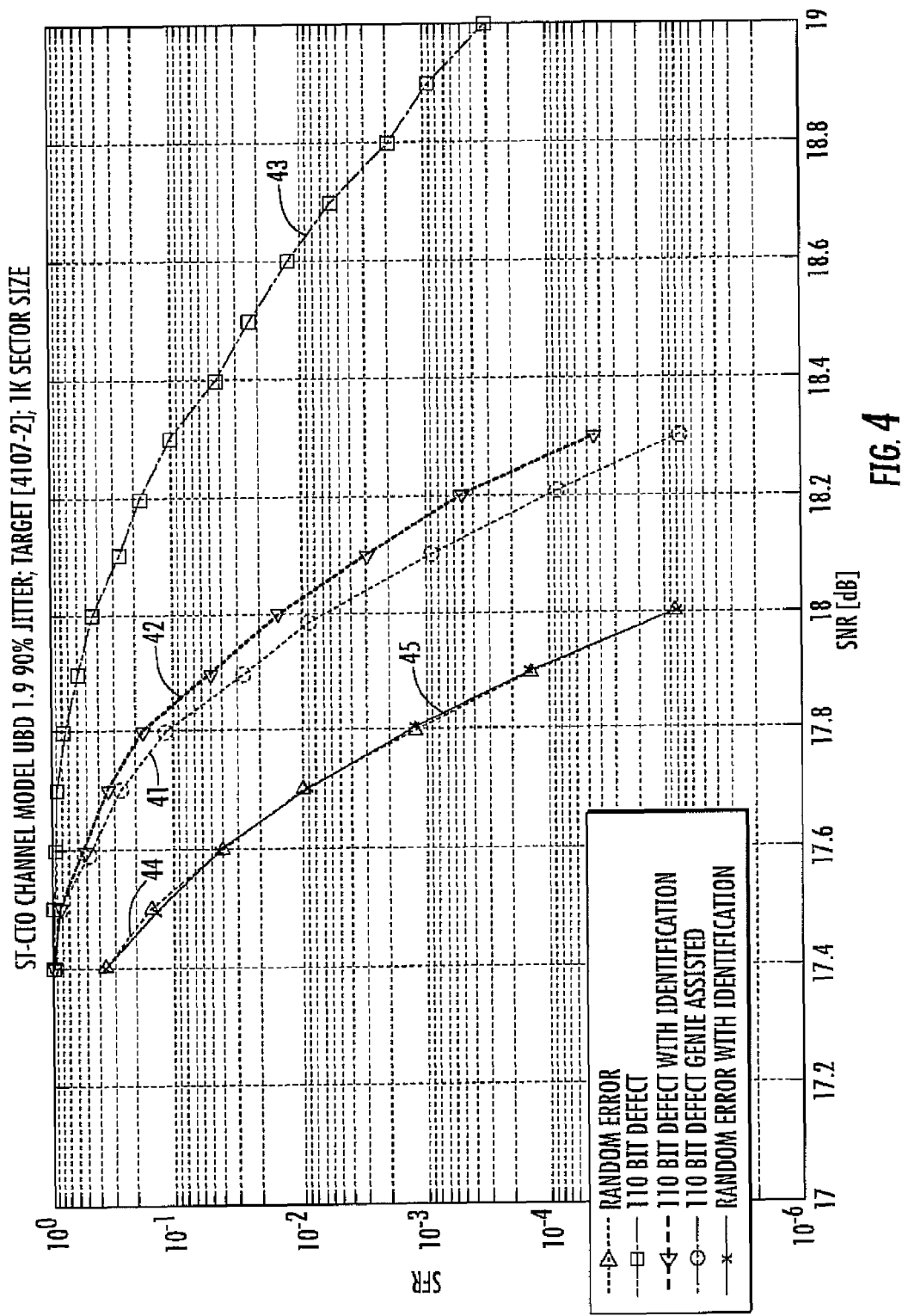
FIG. 4 is a log-linear graph of SFR vs. SNR obtained by the algorithm according to the present invention.

FIG. 4 illustrates the performances of the method in terms of SFR vs. signal-to-noise ratio (SNR). In particular, the burst identification has a reduced affect on the performances in case the burst is not present. In fact a "random error" curve 44, that is SFR in a random noise environment, and a "random error with identification" curve 45, that is SFR in a random noise environment with burst identification switched on are almost superimposed.

Considering the case in which a 110 burst long is inserted, the curve 41 describes the performance of the genie-assisted receiver, meaning that the receiver knows where the burst is. The curve 42 describes the performance of the detection algorithm of the present embodiments. The loss is less than 0.1 dB. The line 43 represents the performance in case no burst detection is performed. The disruptive effect of the burst is evident.

The method described herein may be implemented by a computer program having software code or a computer readable medium storing software code adapted to make a computer execute the method. In particular, the computer program or computer readable medium may store software code that may make the computer identify, in real time, whether a received signal representing symbols, each of which may assume a value of a Galois Field, transmitted over a noisy channel, is corrupted by burst noise or not, according to the method described above.

That which is claimed:

1. A method for identifying a corrupted received signal at a receiver, a received signal including a plurality of symbols, each of the plurality of symbols having a value of a Galois field associated therewith, the receiver being configured to store a logarithm of normalized probability mass functions and corresponding Galois field values for each of the plurality of symbols, the normalized probability mass functions being normalized with respect to a greatest probability mass function of a given symbol of the plurality of symbols, the method comprising:

comparing, at the receiver, for each of the plurality of symbols, a logarithm of normalized probability of an n-th best probability value with a respective threshold, counting a number of the logarithms that exceed the respective threshold and generating, for each of the plurality of symbols, a score corresponding to the number;

calculating a moving average of the scores;

comparing the calculated moving average with an output threshold and flagging a just received one of the plurality of symbols as corrupted based upon the comparison; and updating the respective threshold when each of the plurality of symbols is received by at least calculating a moving average of the n-th best probability value for each of the plurality of symbols, calculating a correction value of the moving average for the just received symbol proportionally to a distance between a first subsequence of last j, wherein j is an integer, elements of the moving averages and a second subsequence of last j elements of the n-th best probability value of each of the plurality of received symbols, and calculating the threshold for the just received symbol as the sum of the moving average and of the correction value.

2. The method of claim 1, wherein the score is equal to the count.

3. The method of claim 1, wherein the method steps are performed in real-time.

4. The method of claim 1, wherein the distance is calculated according to the following formula:

$$L(n; i) = \frac{1}{j} \cdot \sum_{x=i-j+1}^{x=i} |SUPMF(n; x) - AUSPMF(n; x)|$$

wherein L is the distance, SUPMF is a current n-th largest probability mass function, AUSPMF is the moving average, x is an integer, n is an integer, and i is an integer.

5. The method of claim 1, wherein the distance is calculated according to the following formula:

$$L(n; i) = \sqrt{\frac{1}{j} \cdot \sum_{x=i-j+1}^{x=i} (SUPMF(n; x) - AUSPMF(n; x))^2}$$

wherein L is the distance, SUPMF is a current n-th largest probability mass function, AUSPMF is the moving average, x is an integer, n is an integer, and i is an integer.

6. The method of claim 1, wherein the output threshold is heuristically determined.

7. A non-transitory computer-readable medium for use with a computer and for identifying a corrupted received signal at a receiver, a received signal including a plurality of symbols, each of the plurality of symbols having a value of a Galois field associated therewith, the receiver being configured to store a logarithm of normalized probability mass functions and corresponding Galois field values for each of the plurality of symbols, the normalized probability mass functions being normalized with respect to a greatest probability mass function of a given symbol of the plurality of symbols, the computer having computer-readable instructions for causing the computer to perform the steps comprising:

comparing, for each of the plurality of symbols, a logarithm of normalized probability of an n-th best probability value with a respective threshold, counting a number of the logarithms that exceed the respective threshold and generating, for each of the plurality of symbols, a score corresponding to the number;

calculating a moving average of the scores;

comparing the calculated moving average with an output threshold and flagging a just received one of the plurality of symbols as corrupted based upon the comparison; and updating the respective threshold when each of the plurality of symbols is received by at least calculating a moving average of the n-th best probability value for each of the plurality of symbols, calculating a correction value of the moving average for the just received symbol proportionally to a distance between a first subsequence of last j, wherein j is an integer, elements of the moving averages and a second subsequence of last j elements of the n-th best probability value of each of the plurality of received symbols, and calculating the respective threshold for the just received symbol as the sum of the moving average and of the correction value.

8. The non-transitory computer-readable medium of claim 7, wherein the score is equal to the count.

9. The non-transitory computer-readable medium of claim 7, wherein the computer-readable instructions are for causing the computer to perform the steps in real-time.

10. The non-transitory computer-readable medium of claim 7, wherein the distance is calculated according to the following formula:

$$L(n; i) = \frac{1}{j} \cdot \sum_{x=i-j+1}^{x=i} |SUPMF(n; x) - AUSPMF(n; x)|$$

wherein L is the distance, SUPMF is a current n-th largest probability mass function, AUSPMF is the moving average, x is an integer, n is an integer, and i is an integer.

11. The non-transitory computer-readable medium of claim 7, wherein the distance is calculated according to the following formula:

$$L(n;i) = \sqrt{\frac{1}{j} \cdot \sum_{x=i-j+1}^{x=i} (SUPMF(n;x) - AUSPMF(n;x))^2}$$

wherein L is the distance, SUPMF is a current n-th largest probability mass function, AUSPMF is the moving average, x is an integer, n is an integer, and i is an integer.

12. The non-transitory computer-readable medium of claim 7, wherein the output threshold is heuristically determined.

13. A device for identifying a corrupted received signal, a received signal including a plurality of symbols, each of the plurality of symbols having a value of a Galois field associated therewith, the device comprising:
 a detector configured to store a logarithm of normalized probability mass functions and corresponding Galois field values for each of the plurality of symbols, the normalized probability mass functions being normalized with respect to a greatest probability mass function of a given symbol;
 a comparator configured to compare, for each of the plurality of symbols, a logarithm of normalized probability of an n-th best probability value for the given symbol with a respective threshold;
 a counter configured to count the number of the logarithms that exceed the respective threshold;
 a first circuit configured to generate a score corresponding to the number and calculate a moving average of the scores; and
 a further comparator configured to compare the calculated moving average with an output threshold and to flag a just received symbol of the plurality of symbols based upon the comparison;
 said first circuit being configured to
  calculate a moving average of the n-th best probability value for each of the plurality of symbols,
  calculate a correction value of the moving average for the just received symbol proportionally to a distance between a first subsequence of last j, wherein j is an integer, elements of the moving averages and a second subsequence of last j elements of the n-th best probability value of each of the plurality of received symbols, and
  calculate the threshold for the just received symbol as the sum of the moving average and of the correction value.

14. The device of claim 13, wherein the score is equal to the count.

15. The device of claim 13, wherein said first circuit is configured to calculate the distance according to the following formula:

$$L(n;i) = \frac{1}{j} \cdot \sum_{x=i-j+1}^{x=i} |SUPMF(n;x) - AUSPMF(n;x)|$$

wherein L is the distance, SUPMF is a current n-th largest probability mass function, AUSPMF is the moving average, x is an integer, n is an integer, and i is an integer.

16. The device of claim 13, wherein said first circuit is configured to calculate the distance according to the following formula:

$$L(n;i) = \sqrt{\frac{1}{j} \cdot \sum_{x=i-j+1}^{x=i} (SUPMF(n;x) - AUSPMF(n;x))^2}$$

wherein L is the distance, SUPMF is a current n-th largest probability mass function, AUSPMF is the moving average, x is an integer, n is an integer, and i is an integer.

17. The device of claim 13, wherein said first circuit is configured to determine the output threshold heuristically.

* * * * *